(12) United States Patent
Khaselev et al.

(10) Patent No.: US 8,304,062 B2
(45) Date of Patent: Nov. 6, 2012

(54) ELECTRICAL CONDUCTORS AND METHODS OF MAKING AND USING THEM

(75) Inventors: Oscar Khaselev, Monmouth Junction, NJ (US); Nitin Desai, Princeton Junction, NJ (US); Supriya Deverajen, Bangalore (IN); Michael T. Marczi, Chester, NJ (US); Bawa Singh, Voorhees, NJ (US)

(73) Assignee: Fry's Metals, Inc., South Plainfield, NJ (US)

( * ) Notice: Subject to any disclaimer, the term of this patent is extended or adjusted under 35 U.S.C. 154(b) by 0 days.

(21) Appl. No.: 12/175,381

(22) Filed: Jul. 17, 2008

(65) Prior Publication Data
US 2009/0061169 A1    Mar. 5, 2009

Related U.S. Application Data

(60) Provisional application No. 60/951,055, filed on Jul. 20, 2007.

(51) Int. Cl.
*B32B 15/01* (2006.01)
*C03C 29/00* (2006.01)

(52) U.S. Cl. ........ 428/209; 428/621; 428/628; 428/630; 428/673; 174/258; 174/259

(58) Field of Classification Search .................. 428/209, 428/210, 621, 628, 630, 673; 174/255, 258, 174/257, 259
See application file for complete search history.

(56) References Cited

U.S. PATENT DOCUMENTS

| 5,633,047 | A  | * | 5/1997 | Brady et al. ................. | 427/437 |
| 5,668,033 | A  | * | 9/1997 | Ohara et al. ................. | 438/113 |
| 5,855,993 | A  | * | 1/1999 | Brady et al. ................. | 428/209 |
| 6,083,829 | A  | * | 7/2000 | Lai et al. ..................... | 438/643 |
| 6,849,109 | B2 |   | 2/2005 | Yadav et al. | |
| 7,585,549 | B2 | * | 9/2009 | Lewis et al. ................. | 427/458 |
| 2006/0163744 | A1 | | 7/2006 | Vanheusden et al. | |
| 2006/0189113 | A1 | | 8/2006 | Vanheusden et al. | |
| 2008/0032047 | A1 | | 2/2008 | Parashar | |

OTHER PUBLICATIONS

International Search Report of PCT/US08/70474 dated Sep. 25, 2008.
Sabo, C.J. et al., "Silver Thick Film Metallization for Photovoltaics Fired at 300° C", Proceedings International Society for Highbrid Microelectron, Nov. 1, 1985, pp. 59-66.

* cited by examiner

*Primary Examiner* — Cathy Lam
(74) *Attorney, Agent, or Firm* — Lando & Anastasi, LLP (57) ABSTRACT

Certain examples disclosed herein are directed to devices that include a substrate and conductor disposed on the substrate. In some examples, each of the conductor and the substrate may include materials that are mutually insoluble in each other. In other examples, the conductor may further comprise a substantially pure metal. In certain examples, the disposed conductor may be configured to pass adhesion tape test ASTM D3359-02. Methods of forming the conductors are also provided.

4 Claims, 5 Drawing Sheets

ELECTRICAL CONDUCTORS AND METHODS OF MAKING AND USING THEM

PRIORITY APPLICATION

This application claims priority to, and the benefit of, U.S. Provisional Application No. 60/951,055 filed on Jul. 20, 2007, the entire disclosure of which is hereby incorporated herein by reference for all purposes.

TECHNOLOGICAL FIELD

Certain embodiments disclosed herein relate generally to conductors and methods of making them. More particularly, certain examples disclosed herein relate to conductive lines disposed on a substrate to provide one or more conductors of a solar cell.

BACKGROUND

Solar cells may be used to convert light energy from the sun into electrical energy to power one or more electrical devices. The solar cells typically include a collector that receives the current. It is desirable for the collector and other electrically conductive portions of the solar cell to have a high conductance such that the overall efficiency of the solar cell is high. Production of such high conductance conductors on silicon wafers of solar cells can lead to damage of the fragile silicon wafers and greatly reduce the yield of solar cells during manufacturing, which leads to overall increased costs in producing a usable solar cell grid.

SUMMARY

In accordance with a first aspect, a device comprising a substrate and a conductor disposed on the substrate is provided. In certain examples, the disposed conductor and the substrate may each include materials that are mutually insoluble in each other. In some examples, the disposed conductor further comprises a substantially pure metal, and the disposed conductor may be further configured to pass adhesion tape test ASTM D3359-02.

In certain embodiments, the device may further comprise an intermetallic formed between the conductor and the substrate and formed from a material of the conductor and a material of the substrate. In some examples, the intermetallic may be selected from the group consisting of silicon-palladium and silicon-copper. In certain examples, the conductor may comprise a silver nanoink and the substrate may be a silicon wafer. In other examples, the device may further comprise an electroplated material on the conductor. In some embodiments, the substrate of the device may be substantially inert at a temperature below about 400° C. In other embodiments, the disposed conductor may be configured as a pattern or line on the substrate.

In accordance with an additional aspect, a method of forming a conductor comprising depositing a conductor on a substrate and sintering the deposited conductor at a sintering temperature effective to form an intermetallic between the deposited conductor and the substrate is disclosed. In certain examples, the sintering provides a metallurgical bond between the deposited conductor and the substrate, in which the intermetallic is formed from a material of the deposited conductor and a material of the substrate.

In certain examples, the method may further comprise electroplating the sintered conductor with an additional material. In some examples, the sintering temperature may be above 850° C. In certain embodiments, the conductor may be configured as silver and the substrate may be configured as silicon. In certain examples, the method may further comprise depositing a metal on the substrate prior to depositing of the conductor on the substrate, and sintering the deposited metal to provide an additional intermetallic formed from the deposited metal and the substrate. In some examples, the sintering may be performed for an effective time such that the metallurgical bond provides a conductor that is effective to pass adhesion tape test ASTM D3359-02.

In accordance with another aspect, a method of forming an electrical conductor comprising ink-jet printing a silver nanoink on a silicon substrate and sintering the printed silver nanoink and the silicon substrate at an effective temperature such that the printed silver nanoink conductor passes adhesion tape test ASTM D3359-02 is provided.

In certain embodiments, the method may further comprise electroplating the printed silver nanoink with an additional material. In other examples, the printed silver nanoink may be electroplated with copper. In some examples, the effective temperature is also effective to provide for formation of an intermetallic formed from the silver nanoink and the silicon substrate. In some examples, the silver nanoink may be printed as a line or pattern on the silicon substrate. In other examples, the method may further comprise ink-jet printing a metal on the silicon substrate prior to printing of the silver nanoink and heating the printed metal to provide an intermetallic formed from printed metal and the silicon substrate.

Additional aspects, features and examples are described in more detail below.

BRIEF DESCRIPTION OF THE FIGURES

Certain illustrative embodiments are described in more detail below with reference to the accompanying figures in which.

The conductors, substrates and other features shown in the figures are not necessarily drawn to scale. One or more layers or dimensions may have been enlarged, distorted or otherwise shown in a non-conventional or non-proportionate manner to facilitate a better understanding of the technology disclosed herein.

DETAILED DESCRIPTION

Certain embodiments of the devices and methods disclosed herein provide advantages over existing devices and methods including enhanced bonding of conductive materials to substantially inert substrates, increased electrical conductance, reduced costs and simplified production methods. These and other advantages will be recognized by the person of ordinary skill in the art, given the benefit of this disclosure. Certain steps performed below may be performed at atmospheric pressure and conditions, whereas other steps may be performed in a nitrogen atmosphere, for example, under nitrogen gas. For example, where the ink or other materials may oxidize, it may be desirable to perform one or more steps under nitrogen.

Figure 1:
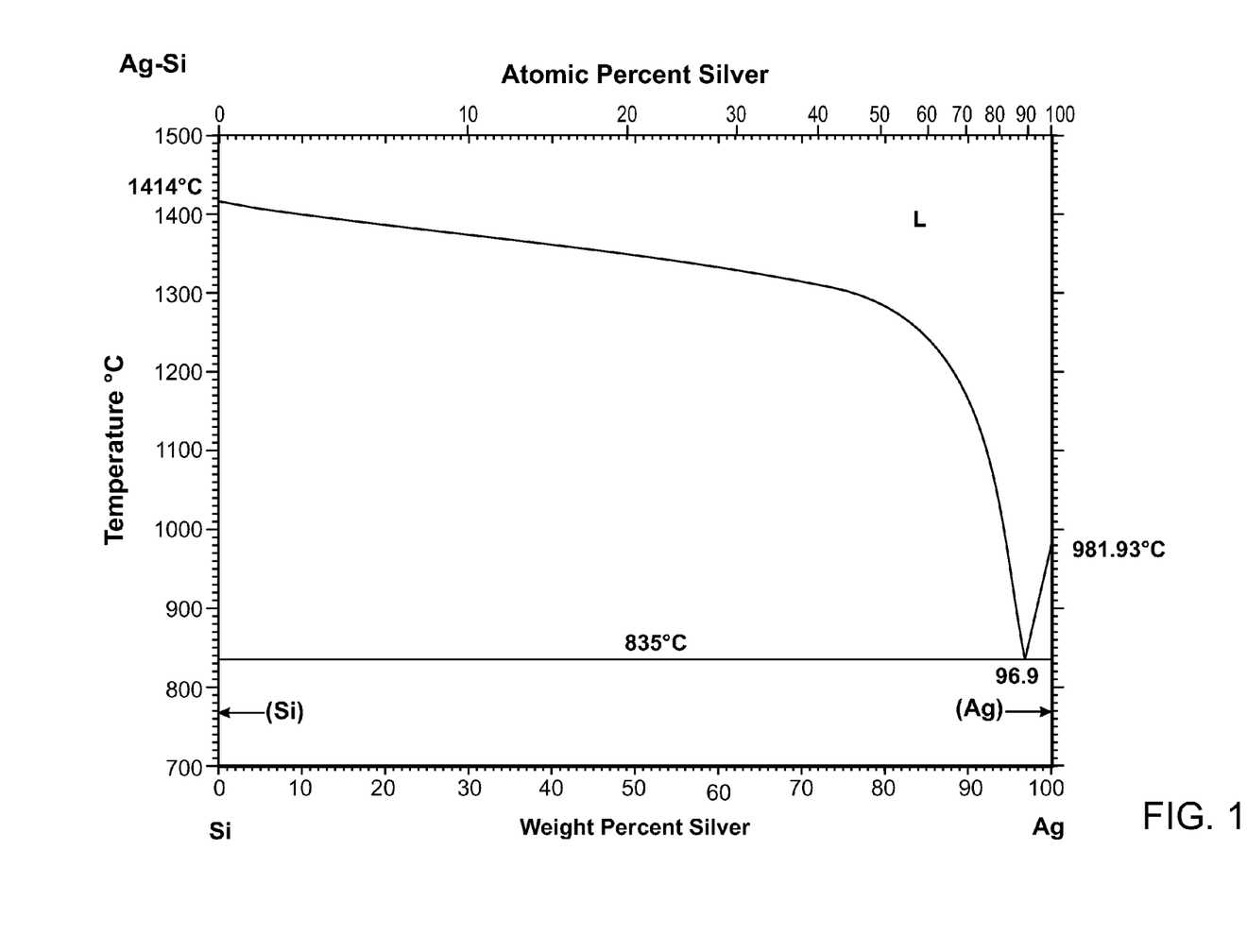
FIG. 1 is a phase diagram of silver and silicon, in accordance with certain examples.

In accordance with certain examples, a device comprising a substrate and an electrical conductor disposed on the substrate is provided. In some examples, the conductor and the substrate may comprise materials that are mutually insoluble in each other. For example, and referring to the phase diagram shown in FIG. 1, silver and silicon are mutually insoluble materials. In particular, pure silver is generally insoluble in silicon, which makes bonding of the silver to a silicon substrate difficult at temperatures below about 835° C. At temperatures above about 835° C., the two materials may form a metallurgical bond. Silicon itself is a substantially inert material and does not react (or reacts very slowly) with metals at temperatures below about 400° C. Thus, the use of mutually insoluble materials together presents several challenges, at least some of which are overcome using certain embodiments of the technology disclosed herein.

Figure 2A:
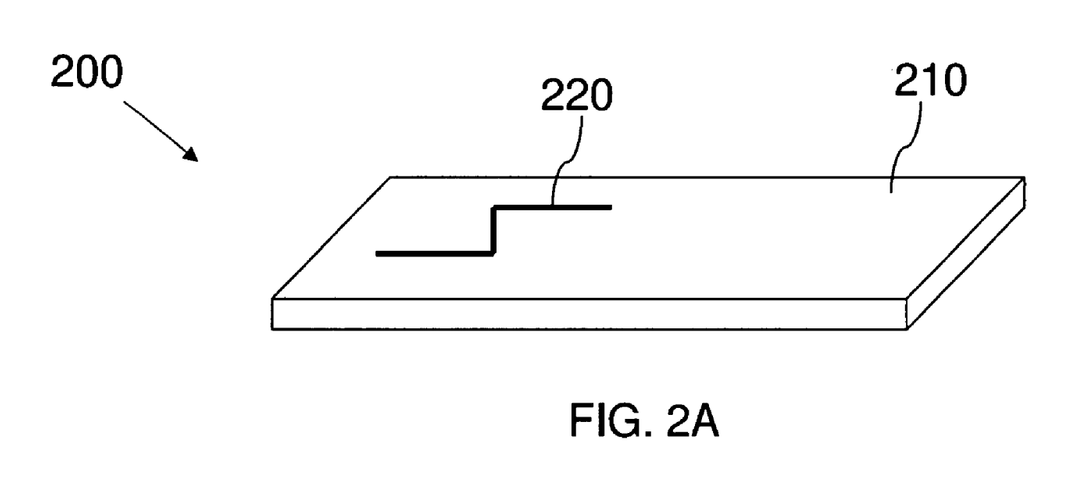
FIG. 2A is a perspective view of a device comprising a substrate with an electrical conductor disposed thereon.
Figure 2B:
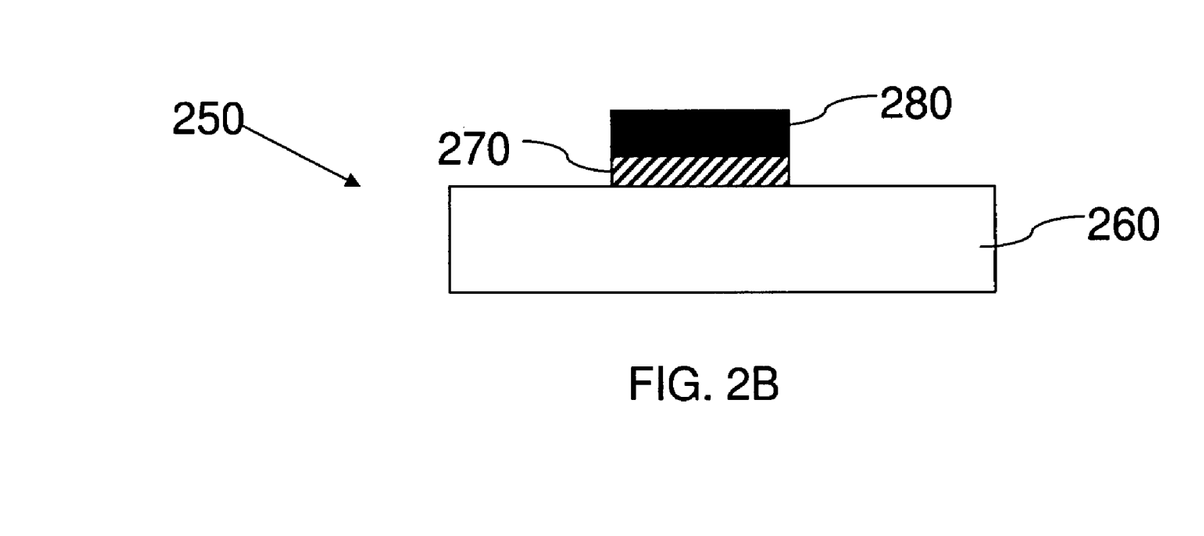
FIG. 2B is a cross-sectional side view of a device comprising a substrate, an intermetallic on the substrate and an electrical conductor on the intermetallic, in accordance with certain examples.

Referring to FIG. 2A, a device 200 comprises a substrate 210 with a conductor 220 disposed thereon. The substrate 210 may take numerous forms and include numerous materials depending on the intended use of the device 200. In some examples, the substrate 210 may be about 12 cm to about 25 cm wide by about 12 cm to about 25 cm long by about 0.01 cm to about 0.025 cm thick. Referring to FIG. 2B, a side view of a device 250 that includes a substrate 260 having a conductor comprising a first material 270 and a second material 280 disposed on the substrate is shown. In certain examples, the first material 270 and the second material 280 may be mutually insoluble in each other. To increase overall adhesion to the substrate 260, the materials 270 and 280 may be sintered at a sintering temperature effective to form an intermetallic between the materials and/or the substrate to provide, for example, a metallurgical bond between the deposited materials and the substrate.

In certain examples, the substrate may include silicon or be a silicon wafer, such as those used to produce solar cells. In other examples, the substrate may include one or more prepregs, such as those used to produce printed circuit boards. Additional materials such as flame retardants, epoxies, underfills and the like may also be included on or in the substrate. Other dimensions and materials for substrates will be readily selected by the person of ordinary skill in the art, given the benefit of this disclosure.

In certain examples, the conductor may include at least one conductive material. In some examples, the conductor includes one or more nanoinks, such as those described in commonly assigned U.S. patent application Ser. No. 11/462,089 titled "PARTICLES AND INKS AND FILMS USING THEM" and filed on Aug. 3, 2006, the entire disclosure of which is hereby incorporated herein by reference for all purposes. These materials can produce electrical lines with a very low electrical resistance, e.g., 3-4 microOhm-cm or less. In certain examples, a metal or metal salt may be mixed with and a capping agent in a single phase solution. In certain examples, the metal or metal salt may be selected from conductive metals or conductive metal salts including, for example, transition metals or transition metal salts of gold, silver, copper, nickel, platinum, palladium, iron, and alloys thereof. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Additional anions will be selected by the person of ordinary skill in the art, given the benefit of this disclosure.

In certain examples, the use of a single phase solution to produce the particles for use in the electrical conductors permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, the metal used to provide the particles for use in the electrical conductors may be uncomplexed or may be complexed with one or more ligands. For example, the metal may be complexed with EDTA, ethylenediamine, oxalate, 2,2'-bypyridine, cyclopentadiene, diethylenetriamine, 2,4,6-trimethylphenyl, 1,10-phenanthroline, triethylenetetramine or other ligands. In certain examples, the metal or metal salt may be dissolved in a solvent or a solvent system to provide a clear, but not necessarily colorless, solution. For example, a suitable amount of metal or metal salt may be added to a solvent such that when the metal or metal salt goes into solution, the overall solution is clear. The overall solution may be colored or may be colorless. Suitable solvents include, but are not limited to, ethylene glycol, methanol, ethanol, propanol, isopropanol, butanol, isobutyl alcohol, pentanol, isopentanol, hexanol and aliphatic alcohols having from about 1 to about 10 carbon atoms. Additional suitable solvents include, but are not limited to, benzene, toluene, butylenes, polyisobutylene, Isopar® solvents commercially available from Exxon and aromatic compounds having aliphatic side chains that include 2-6 carbon atoms. Suitable solvent systems include mixtures of the illustrative solvents discussed herein and other fluids that are soluble, miscible or partially miscible with such illustrative solvents. In certain examples, the combination of solvents provides a single phase. To achieve a single phase when using a mixture of solvents, the amounts of each solvent may be adjusted such that a single phase results when the solvents are mixed. Should more than one phase be present upon mixing, the relative amounts of one or more of the solvents can be altered, e.g., increased or decreased, until a single phase is observed.

In accordance with certain examples, the metal particles may be mixed with a capping agent. The capping agent may be effective to isolate the particle and limit the size of its growth. In certain examples, the capping agent may be a high molecular weight capping agent, e.g., has a molecular weight of at least about 100 g/mol. Illustrative capping agents include, but are not limited to, organic amines having 12 or more carbon atoms. In certain examples, the organic amine has at least 16 carbon atoms, e.g., hexadecylamine. The organic moiety of the amine may be saturated or unsaturated and may optionally include other functionalities such as, for example, thiols, carboxylic acids, polymers, and amides. Another group of illustrative capping agents suitable for use with the metals of the electrical conductors disclosed herein are thiols having 12 or more carbon atoms. In certain examples, the thiol has at least 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like. Additional suitable capping agents will be readily selected by the person of ordinary skill in the art, given the benefit of this disclosure.

In certain examples where a capping agent is used with metal particles to provide an electrical conductor, the capping agent may be dissolved in a suitable solvent prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step. In certain examples, the exact amount of capping agent added to the metal solution may vary depending on the desired properties of the resulting capped particles. In some examples, a suitable amount of capping agent is added to provide at least about 2% by weight capping agent in the capped particles. It will be recognized by the person of ordinary skill in the art, given the benefit of this disclosure, that it may be desirable to use more or less capping agent depending on the desired properties of the particles. For example, to increase the conductivity of particles disposed on a substrate, e.g., a printed circuit board, it may be desirable to adjust the amount of capping agent until the conductivity is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution could be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure. In certain examples, the capping agent and the metal solution may be mixed using conventional techniques such as stirring, sonication, agitation, vibration, shaking or the like. In some examples, the capping agent may be added to the metal solution while the metal solution is being stirred. In certain examples, the mixture of capping agent and metal solution may be stirred until a clear and/or colorless single phase solution results.

In accordance with certain examples, a reducing agent may be added to the metal-capping agent solution prior to, of after, deposition on a substrate. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo) dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, e.g., $Ag^{+1}$ may be converted to $Ag^0$. In some examples, the reducing agent may be dissolved in a solvent prior to addition to the metal-capping agent solution, whereas in other examples, the reducing agent may be added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms, e.g., linear, cyclic or aromatic solvents having six or more carbon atoms. The person of ordinary skill in the art, given the benefit of this disclosure, will be able to select suitable solvents for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, e.g., about 30° C. to about 70° C., to speed the reduction process. When an elevated temperature is used, it may be desirable to keep the temperature below the boiling point of the solvent or solvent system to reduce the likelihood of solvent evaporation, though in some examples, it may be desirable to reduce the overall volume of solvent.

In accordance with certain examples, the metal particles may be isolated from the single phase solution prior to deposition on a substrate. Isolation may occur, for example, by decanting, centrifugation, filtering, screening or addition of another liquid that the capped metal particles are insoluble in, e.g., extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, e.g., if the metal particles are produced in about five Liters of solvent, then about 20 Liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein. In other examples, the capped metal particles may remain in a single phase solution and the particles may be disposed on a silicon substrate (or other suitable substrate) in, for example, a mold, form or pattern on the substrate. The high temperatures of the sintering process results in evaporation of the solvent and sintering of the metal particles, which can provide a metallurgical bond to enhance adhesion of the conductor to the substrate.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry. In an alternative embodiment, a separate drying step may be omitted, and the particles may be dried during the sintering process.

In accordance with certain examples, the capped particles may be processed to remove the capping agent prior to use. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, e.g., the capping agent is present at less than 0.5% or 0.1% by weight. In some examples, the capping agent may be removed to provide a substantially pure metal, e.g., substantially pure silver, that may be deposited on the substrate.

In accordance with certain examples, the metal particles may be used to provide an ink that may be used to deposit the metal particles on a sintering substrate. In some examples, a selected amount of particles are dispersed in a carrier to provide an ink. The exact amount of the particles selected may vary, and typically a suitable amount of particles (either capped or uncapped) are used to provide a dispersion including about 10-90 weight percent particles, more particularly about 20-80 weight percent particles, e.g., about 20-25 weight percent particles. In embodiments where capped particles are used, the amount of the capped particles used may be altered to account for the additional weight added by the capping agent. In other examples, a sufficient amount of particles are used to provide a desired viscosity for the dispersion. For example, the viscosity of the dispersion may vary depending on the method or devices that the ink is to be used in. In examples where the ink is intended to be used in spin coating applications, a sufficient amount of particles may be selected to provide an ink viscosity of about 0.25 centipoise to about 2 centipoise, more particularly about 0.5 centipoise to about 1.5 centipoise, e.g., about 1 centipoise. In examples where the ink is intended to be used in ink-jet printing applications, a sufficient amount of particles may be selected to provide an ink viscosity of about 5 centipoise to about 20 centipoise, more particularly about 7 centipoise to about 15 centipoise, e.g., about 8-10 or 8-9 centipoise. Additional ink viscosities for depositing the ink on a sintering substrate using a selected method will be readily selected by the person of ordinary skill in the art, given the benefit of this disclosure.

In accordance with certain examples, the carrier of the ink may be any medium or fluid, e.g., a liquid or a gas, that can effectively disperse the particles in a selected manner, e.g., spin coating, ink-jet printing, screen printing, paste printing, etc. In certain examples, the carrier may be a volatile organic medium that can be evaporated or removed to leave a coating, film or desired shape or pattern of the particles on a sintering substrate. Illustrative volatile organic media include, but are not limited to, toluene, hexanes, and saturated and unsaturated hydrocarbons including from about 4 to about 10 carbon atoms. In an alternative configuration, the carrier may be selected such that it is volatile at the sintering temperature such that the carrier fluid evaporates during the sintering process. Additional suitable carriers will be readily selected by the person of ordinary skill in the art, given the benefit of this disclosure.

In accordance with certain examples, the conductor may be disposed on the substrate using many different methods including, but not limited to, spin coating, ink-jet printing, screen printing, paste printing or combinations thereof. In some examples, ink-jet printing may be used to rapidly deposit the conductor onto the substrate. Illustrative ink-jet printing systems that may be used include, but are not limited to, Dimatix DMP, Pixdro LP-150 or others. Ink-jet printing is an attractive alternative to screen-printing or vacuum evaporation for fabrication of the front contacts to solar cells. Vacuum deposition is effective but uses patterning and expensive equipment. Screen-printing is a low-cost, atmospheric process but may be limited by resolution and throughput. Also screen printing can cause unwanted (3%) breakage of thin silicon wafers used for solar cell manufacturing. Also, ink-jet printing is a process well suitable for mass manufacturing of solar cells. Ink-jet printing can provide better line resolution and improved aspect ratios for the conducting grid lines, which can lead to improved solar cell performance. A significant advantage of ink-jet printing over screen-printing is that it is a non-contact, conformal deposition technique and therefore it is especially suitable for processing fragile and thin polysilicon wafers.

In certain examples, the exact dimensions and shapes of the disposed conductor may vary. In some examples, the conductor may be disposed to a desired thickness which may vary depending on the intended use of the conductor. In other examples, the dimensions of the disposed conductor may be about 50 microns to about 300 microns wide by about 0.25 microns to about 3 microns tall. In some examples, the conductor may be disposed in suitable dimensions and in a suitable amount to provide a front contact to a solar cell. Typical cross-sectional dimensions of solar cell collection silver lines is about 100-150 microns by about 5-15 microns, e.g., about 100 microns by about 7 microns. The exact shape of the disposed conductor may vary and in some examples, the conductor is linear, curvilinear, patterned or may include one or more common geometric shapes, e.g., circular, square, triangular, or the like when viewed from the top of the device. Additional thicknesses and shapes will be readily selected by the person of ordinary skill in the art, given the benefit of this disclosure.

Figure 3A:
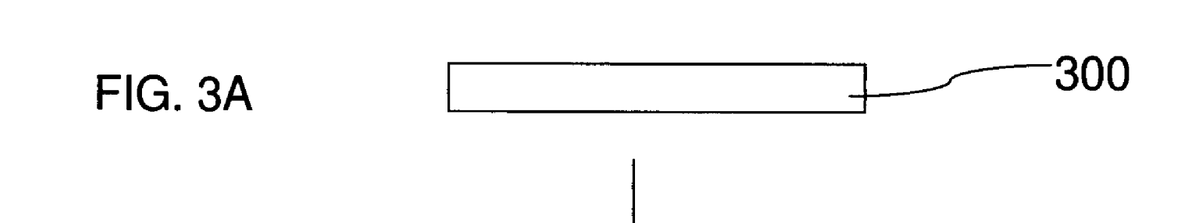
FIGS. 3A-3C schematically show a process for forming an electrical conductor on a substrate, in accordance with certain examples.
Figure 3B:
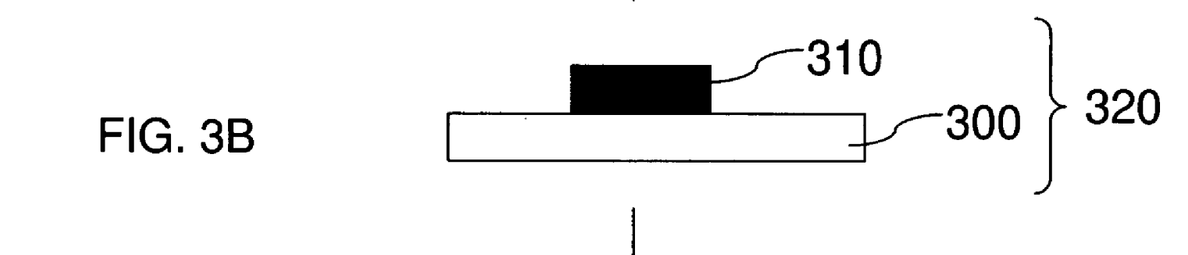
Figure 3C:
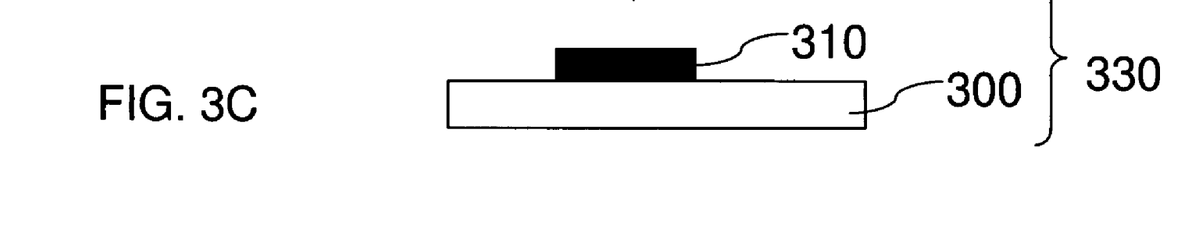

In some examples, the conductor may be disposed on the substrate and then heated or sintered at an effective temperature to provide a metallurgical bond between them. As used herein, a "metallurgical bond" is a bond between a metal and another material, which may also be a metal, that is substantially free of cracks, voids or discontinuities. A metallurgical bond may be formed as one material diffuses into another. Without wishing to be bound by any particular scientific theory, formation of a metallurgical bond provides good adhesion between materials which are mutually insoluble in each other or between materials where one of the materials is substantially inert. In some examples, the metallurgical bond may be provided by heating or sintering the materials at an elevated temperature. A schematic of this process is shown in FIGS. 3A-3C. A substrate 300 is shown in FIG. 3A. A conductor 310 is first deposited on the substrate 300 to provide a device 320 (FIG. 3B). The device 320 may be heated at a sintering temperature to provide a metallurgical bond between the conductor 310 and the substrate 300 to provide device 330 (FIG. 3C). The exact temperature used to provide a metallurgical bond, depends at least in part, on the materials present in the conductor and the substrate. In examples where silver is used as a conductor and silicon is used as a substrate, the sintering temperature is about 835° C. or more to provide a metallurgical bond. In examples where nickel is used as a conductor and silicon is used as a substrate, the sintering temperature is about 450° C. or more to provide a metallurgical bond. Additional suitable sintering temperatures will be readily selected by the person of ordinary skill in the art, given the benefit of this disclosure, for particular conductors and substrates using the physical properties of such conductors and substrates.

In accordance with certain examples, by providing a metallurgical bond to enhance bonding of the conductor to the substrate, the conductor may pass adhesion tape test ASTM D3359-02 dated Aug. 10, 2002 and entitled "Standard Test Methods for Measuring Adhesion by Tape Test." A significant advantage of passing such tape test is that adhesion is sufficient to permit further processing or treatment of the conductor using other physical or chemical methods. For example, the conductor may be electroplated with one or more other materials. Additional materials may be disposed on the conductor using, for example, vapor deposition, ink-jet printing or the like. Disposal of such additional materials may be advantageous to reduce the amount of substantially pure metal deposited on the substrate, e.g., to lower the overall production cost by using less substantially pure silver. For example, it may be desirable to deposit copper or other materials on substantially pure silver to increase the overall thickness of the conductor while reducing the overall manufacturing costs of the device.

In accordance with certain examples, one or more intermetallics may be provided or formed between the conductor and the substrate. As used herein, the term "intermetallic" refers to the bonding or interaction of two or more materials, at least two of which are metals or metalloids, to provide a new compound or alloy. The intermetallic may enhance, or in certain instances may provide, the metallurgical bond between the conductor and the substrate. Illustrative metals that may be used to provide an intermetallic include, but are not limited to, transition metals such as silver, gold, copper, platinum, palladium, nickel, aluminum, tin and alloys thereof. Illustrative metalloids that may be used to provide an intermetallic include, but are not limited to, boron, silicon, germanium, arsenic, tellerium, arsenic, antimony. In some examples, certain allotropes of carbon (e.g., graphite), phosphorous (e.g., black phosphorous), tin (e.g., white tin), selenium (e.g., trigonal form) may also be used as metalloids to provide an intermetallic. In some examples, the intermetallic may be formed from at least one material of the conductor and at least one material of the substrate. For example, after deposition of the conductor on the substrate, the entire assembly may be heated such that bonding is enhanced by formation of an intermetallic at the interface of the substrate and the conductor. The formation of such intermetallics may be particularly desirable where the materials of the conductor have little or no adhesion to the substrate, e.g., where the conductor would fail an adhesion tape test. Illustrative intermetallics include but are not limited to those formed between silver and silicon, those formed between palladium and silicon, those formed between gold and silicon, those formed between copper and silicon, those formed between platinum and silicon, those formed between nickel and silicon and those formed between silicon and a mixture of two or more conductive materials such as, for example, a mixture of two or more of silver, gold, palladium, copper, platinum, nickel and the like.

The exact ratio of each component in the intermetallic may vary, and, in certain examples, the amount of each material present is sufficient to permit the conductor to pass an adhesion tape test after deposition on the substrate and subsequent formation of an intermetallic. Illustrative ratios of components in certain intermetallics include, but are not limited to, 1:1 or 2:1 for nickel:silicon and 1:1 or 2:1 for palladium:silicon. The particular ratios that are present in the intermetallic may vary depending on the materials used and so long as the conductor remains highly conductive, the exact ratio present is not critical.

In other examples, the substrate may be a metal or material other than silicon or may include a coating of a metal or material other than silicon that is deposited on a silicon substrate. Such other materials may be desirable where the intermetallic formed between the conductor and the silicon fails an adhesion tape test. For example, it may be desirable to coat a silicon substrate with a thin layer of a conductive material other than that used in the conductor to enhance bonding of the conductor to the silicon substrate. In one configuration, a thin layer, coating or pattern of substantially pure silver, e.g., such as those that may be produced by depositing a silver nanoink, may be deposited between the conductor and the silicon substrate to further enhance bonding of the conductor to the substrate and to increase the conductance without resorting to the use of substantial amounts of silver in the conductor itself. In another configuration, a dopant may be added or placed on a silicon substrate such that after deposition of a conductor on the dopant, formation of an intermetallic between the conductor, dopant and silicon substrate permits passage of an adhesion tape test by the conductor. Illustrative dopants include, but are not limited to, the metals and metalloids disclosed herein, conductive adhesives, and other materials that may impart a desired physical or chemical property.

In accordance with certain examples, there may be instances where a desired conductive material does not form an intermetallic with the substrate that provides sufficient adhesion between the conductor and the substrate. In such instances it may be desirable, for example, to first deposit another material on the substrate that is known to form an intermetallic with the substrate upon heating to a suitable temperature. After formation of the intermetallic, the desired conductor may be deposited on the intermetallic to provide a conductor with suitable adhesion. Optionally, after deposition of the desired conductor, the entire assembly may be heated such that a second intermetallic is formed between the conductor and the first intermetallic. By formation of multiple intermetallics, the overall adhesion of the conductor to the substrate may be increased.

In certain examples, one or more additional materials may be electroplated on the conductor. Such electroplating may take place prior to or after formation of an intermetallic, as described above. Electroplating provides a thin layer of a conductive material on the disposed conductor. In some examples, electroplating may be used to deposit additional layers of material on the conductor such that the conductor has a desired thickness and/or dimensions. In some examples, electroplating may be used to deposit a coating or layer having a thickness of about 2 microns to about 20 microns, more particularly about 10 microns to about 12 microns. Illustrative materials that may be electroplated on a desired surface include, but are not limited to, copper, silver, nickel or other metals.

In accordance with certain examples, such electroplating may be performed using conventional methods. For example, the component to be electroplated may act as a cathode such that immersion of the component in an electrolyte bath comprising cations will result in deposition and reduction of such cations on the component (when an electric current is applied) to provide a coating or layer of the material on the component. This process may be performed until a desired thickness is achieved. This process may also be performed in the presence of different cations such that an alloy or intermetallic of many different materials may be formed. The electroplating may take place in an electrolyte bath, i.e., tank plating, or brush electroplating processes may be performed. In some examples, one or more surfaces of the conductor may be masked such that substantially no material is electroplated onto that surface. By masking certain surfaces, the thickness in a particular dimension may be selected or controlled. In embodiments where the conductor is printed as a pattern, selected portions of the conductor may be masked to prevent electroplating of those surfaces. Suitable materials for use as a mask include, but are not limited to, SU-8, SU-8 2000 or SU-8 3000 photoresists (available from Microchem). Additional suitable materials for use as a mask will be readily selected by the person of ordinary skill in the art, given the benefit of this disclosure. The mask may be deposited in numerous manners using, for example, any one or more of the deposition methods described herein, e.g., coating or ink-jet printing. In another embodiment, substantially all surfaces of the conductor may be electroplated, and material on one or more surfaces may be polished, etched or otherwise removed until a desired thickness is achieved in a particular dimension.

In accordance with certain examples, the devices disclosed herein may be produced by ink-jet printing of suitable materials on a selected substrate. One advantage of inkjet printing to provide a solar cell is that it is a non-contact technique and reduces the likelihood of damaging fragile polysilicon wafers during deposition of the conductor. In some examples, the inkjet printer may include a first cartridge comprising a conductive material disposed in a suitable delivery fluid for deposition on the substrate. In other examples, the printer may include additional cartridges which comprise other materials that may be printed onto the substrate, e.g., fluxes, solders or the like. By including multiple cartridges of different materials in an inkjet printer, the overall production time of the devices disclosed herein may be reduced.

In accordance with certain examples, the inkjet printer is typically controlled by a computer or other device such that a desired printing pattern and/or a desired printing thickness may be selected. As discussed herein, illustrative printing patterns include lines, geometric shapes and the like any of which may be produced using inkjet printing. The particular sequence of deposition may be programmed or selected using the computer such that the various materials may be deposited on the substrate in a desired order and in a desired amount. The ink-jet printer may be configured for single pass printing, where substantially all of the desired material is deposited in an area with a single pass of the print head or for multiple pass printing, where less than substantially all of the desired material is deposited in a single pass and the multiple passes are used to build up the material to a desired thickness of desired dimensions. Illustrative ink-jet printers for use with the materials disclosed herein include, but are not limited to, Dimatix DMP, Pixdro LP-150 and others. Illustrative print heads and sizes for use in producing the devices disclosed herein include, but are not limited to, Pixdro printing heads, Spectra SE 128 AA print heads and the like.

In accordance with certain examples, additional material deposition processes may be used after some portion of the conductor is deposited on the substrate. Such additional deposition processes include, but are not limited to, screen-printing, vacuum evaporation, physical vapor deposition, chemical vapor deposition, spin coating, sputtering and the like. The additional material deposition processes may be used in connection with production of the conductor or may be used for other portions of the device that includes at least one conductor.

In accordance with certain examples, solder joints may be produced using the materials and methods disclosed herein. For example, one or more silver nanoinks may be deposited around or under a component to be soldered to a substrate, and after heating, an intermetallic may form and act as a solder joint to hold the component to the substrate and provide an electrical connection between the component and the substrate. The exact materials that remain in the solder joint are not necessarily the same as those deposited on the substrate, e.g., the amount of capping agent may be reduced, any resulting alloys that are formed may include an altered amount of components as compared to the components that were deposited prior to soldering.

In accordance with certain examples, a method of forming a conductor on a substrate is provided. In certain examples, the method comprises depositing the conductor on a substrate and sintering the printed conductor at a sintering temperature effective to provide a metallurgical bond between the conductor and the substrate. In some examples, the sintered conductor may receive one or more additional materials, e.g., through electroplating or other material deposition processes. In certain examples, the sintering temperature may be effective to provide one or more intermetallics formed from the deposited conductor and the substrate. In other examples, the method may further comprise electroplating the sintered conductor with at least one additional material, as described above. In some examples, the methods disclosed herein permit the use of substantially pure silver and a silicon substrate together, which are otherwise mutually insoluble and tend not to adhere to each other. In certain examples, the method may further comprise depositing a metal on the substrate prior to depositing of the conductor on the substrate, and heating the deposited metal to provide another intermetallic. Such deposition of an additional metal may be useful, for example, where the conductor and the substrate do not substantially form an intermetallic themselves that can provide an adequate metellurgical bond. In some examples, formation of a metallurgical bond, either between the conductor and the substrate or between the conductor, substrate and one or more intervening layers or coatings, provides a conductor that is effective to pass adhesion tape test ASTM D3359-02.

In accordance certain examples, a method of forming an electrical conductor comprising ink-jet printing a silver nanoink on a silicon substrate and heating the printed silver nanoink and the silicon substrate to an effective temperature such that the printed silver nanoink conductor passes adhesion tape test ASTM D3359-02 is provided. The ink-jet printing may be performed, for example, as described elsewhere herein. Similarly, the silver nanoink may be prepared as described above and in the commonly assigned patent application incorporated herein by reference. The sintering temperature depends, at least in part, on the materials selected, and, in certain examples, the sintering temperature is high enough such that a metallurgical bond and/or an intermetallic forms, e.g., about 835° C. or higher for silver and silicon. In some examples, the method may further comprise electroplating the printed silver nanoink, e.g., with copper or other suitable materials. In other examples, the method may further comprise printing the conductor in a selected line or pattern on the silicon substrate.

Certain specific examples are described below to illustrate further some of the advantages provided by the devices and methods disclosed herein.

Example 1

Figure 4A:
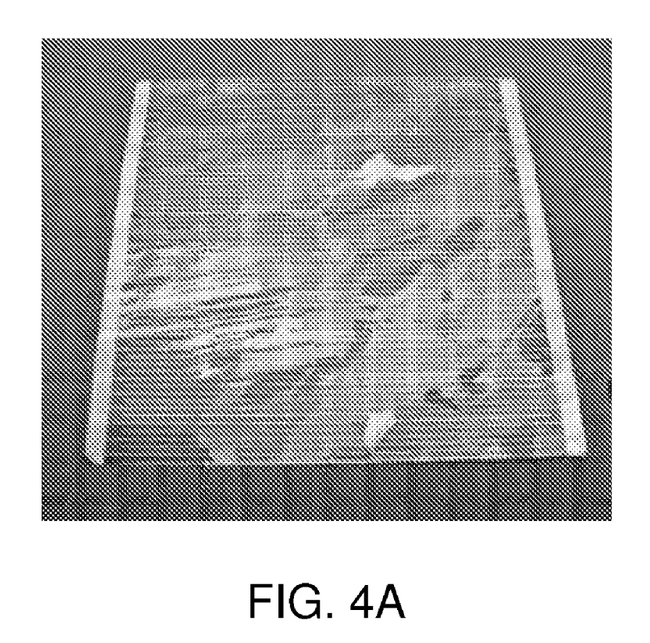
FIG. 4A is a photograph showing a conductor that failed an adhesion tape test.

Silver lines were deposited on a silicon substrate, sintered at 300° C., and copper was electroplated directly on silver lines sintered at a temperature of 300° C. in a copper bath containing 200 g/L $CuSO_4$ and 50 g/L $H_2SO_4$. After electroplating, the printed/plated structures peeled off the silicon substrates, as shown in FIG. 4A.

Figure 4B:
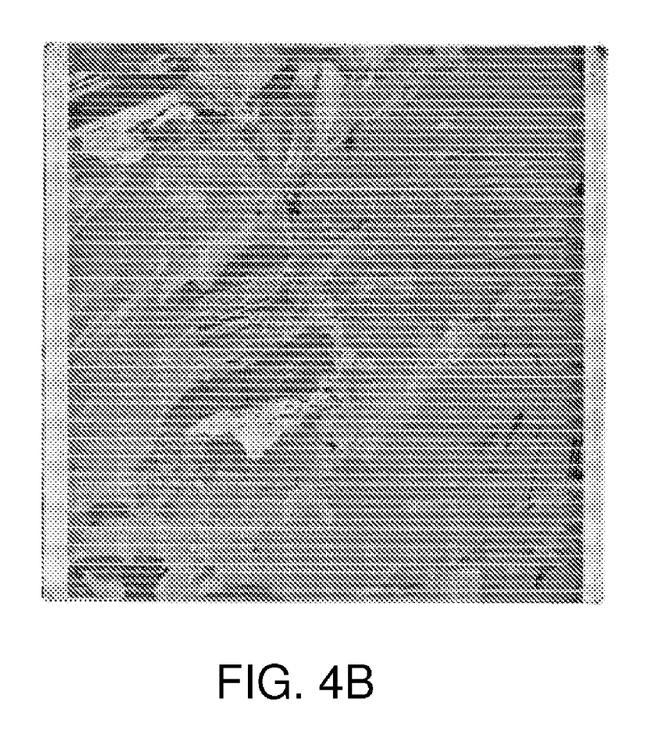
FIG. 4B is a photograph showing a conductor that passes an adhesion tape test, in accordance with certain examples.

In contrast, when the same sintered silver lines were heat treated at 850° C. for 30 seconds prior to electroplating, they could be electroplated and easily passed an adhesion tape test (ASTM D3359-02 dated Aug. 10, 2002) after electroplating, as shown in FIG. 4B.

Example 2

Figure 5:
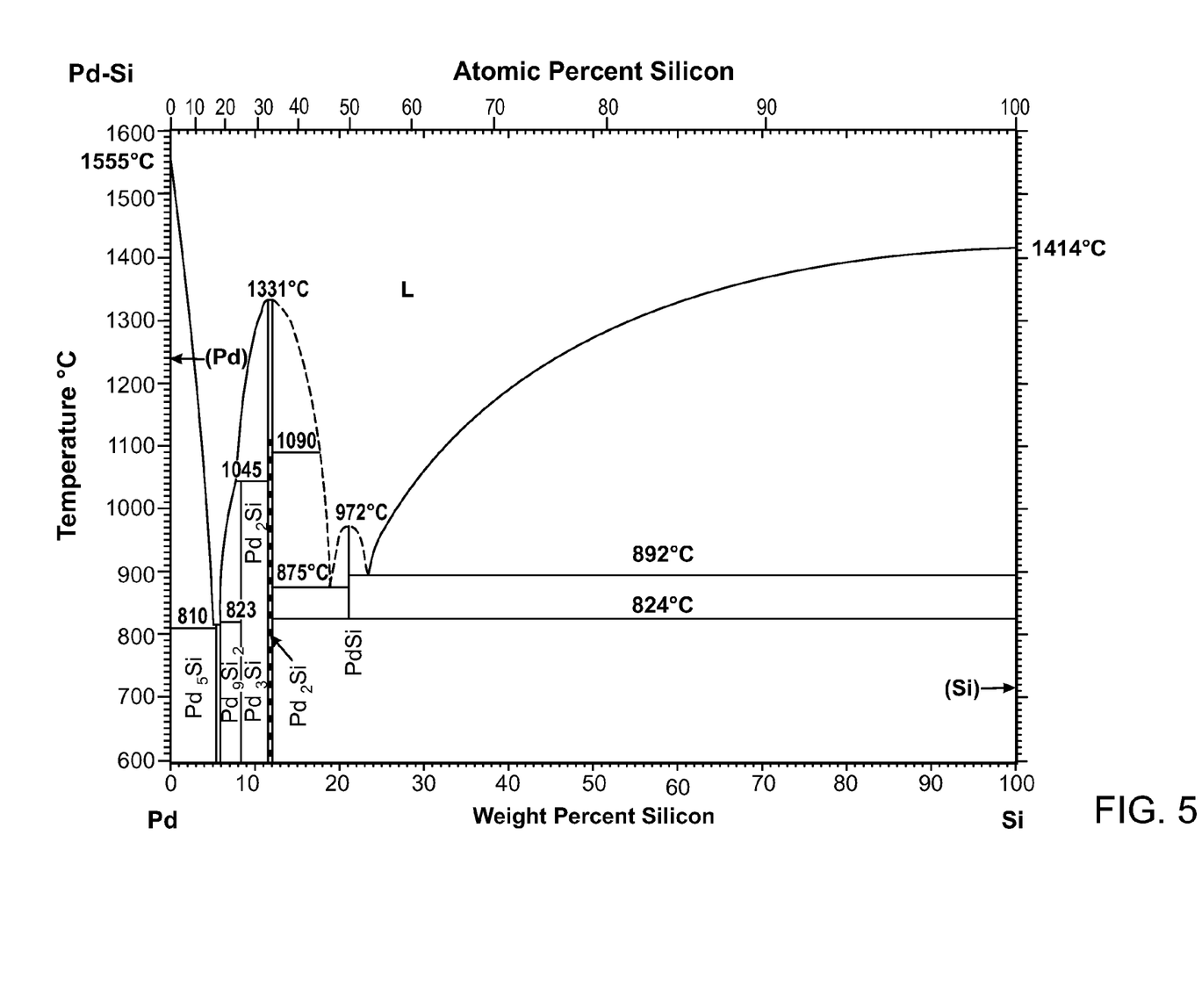
FIG. 5 is a phase diagram of silicon and palladium, in accordance with certain examples.

A nanosilver-nanopalladium (50-50%) alloy ink was prepared according to the methods disclosed in U.S. application Ser. No. 11/462,089 and was used to print lines and produce films on a silicon substrate. The ink alloy was capped with 12% by weight dodecanethiol. The ink was deposited directly on the silicon substrate. As in the case of pure silver, sintering at 300° C. was not sufficient for good adhesion after electroplating. This result was consistent with the properties of silicon and palladium, as shown in the phase diagram of FIG. 5.

The printed lines were heat treated at 450° C. for 30 seconds. After such treatment, films could be plated in a copper electroplating solution (as described in Example 1) with good adhesion.

Example 3

A nanosilver-nanonickel (50-50%) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 4

A nanosilver-nanopalladium (1:2 ratio by weight) alloy ink may be prepared according to the methods disclosed in U.S. application Ser. No. 11/462,089 and was used to print lines and produce films on a silicon substrate. The ink alloy may be capped with 12% by weight dodecanethiol or 12% by weight hexadecylamine. The ink may be deposited directly on the silicon substrate. The printed lines may be heat treated at 450° C. for 30 seconds. After such treatment, films may be plated in a copper electroplating solution (as described in Example 1) with good adhesion.

Example 5

A nanosilver-nanonickel (1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 6

A nanosilver-nanopalladium (2:1 ratio by weight) alloy ink may be prepared according to the methods disclosed in U.S. application Ser. No. 11/462,089 and was used to print lines and produce films on a silicon substrate. The ink alloy may be capped with 12% by weight dodecanethiol or 12% by weight hexadecylamine. The ink may be deposited directly on the silicon substrate. The printed lines may be heat treated at 450° C. for 30 seconds. After such treatment, films may be plated in a copper electroplating solution (as described in Example 1) with good adhesion.

Example 7

A nanosilver-nanonickel (2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 8

A nanosilver-nanogold (1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 9

A nanosilver-nanogold (2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 10

A nanosilver-nanogold (1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 11

A nanosilver-nanocopper (1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 12

A nanosilver-nanocopper (2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 13

A nanosilver-nanocopper (1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 14

A nanosilver-nanoplatinum (1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 15

A nanosilver-nanoplatinum (2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 16

A nanosilver-nanoplatinum (1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 17

A nanosilver-nanoplatinum-nanopalladium (1:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 18

A nanosilver-nanoplatinum-nanopalladium (2:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 19

A nanosilver-nanoplatinum-nanopalladium (1:2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 20

A nanosilver-nanoplatinum-nanopalladium (1:1:2 ratio by weight) alloy ink may be prepared according to the methods disclosed in U.S. application Ser. No. 11/462,089 and may be used to print lines and produce films on a silicon substrate.

The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion.

Example 21

A nanosilver-nanoplatinum-nanocopper (1:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 22

A nanosilver-nanoplatinum-nanocopper (2:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 23

A nanosilver-nanoplatinum-nanocopper (1:2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 24

A nanosilver-nanoplatinum-nanocopper (1:1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 25

A nanosilver-nanocopper-nanopalladium (1:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 26

A nanosilver-nanocopper-nanopalladium (2:1:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 27

A nanosilver-nanocopper-nanopalladium (1:2:1 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

Example 28

A nanosilver-nanocopper-nanopalladium (1:1:2 ratio by weight) alloy ink may be prepared according to the methods disclosed in U.S. application Ser. No. 11/462,089 and may be used to print lines and produce films on a silicon substrate. The ink alloy may be capped with 10-12% by weight dodecanethiol or 10-12% by weight hexadecylamine. The ink may be deposited directly on a silicon substrate. The printed lines may be heat treated at 450° C. for 30 seconds. After such treatment, films may be plated in a copper electroplating solution (as described in Example 1) with good adhesion. One or more of the steps may be performed in a nitrogen atmosphere, for example, under nitrogen gas.

When introducing elements of the aspects, embodiments and examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A device comprising:
    a silicon substrate;
    a conductor comprising a substantially pure silver disposed on the substrate; and
    a metallurgical bond between the conductor and the silicon substrate at an interface between the conductor and the silicon substrate,
    in which the conductor and the silicon substrate are mutually insoluble, and in which the conductor is further configured to pass adhesion tape test ASTM D3359-02.

2. The device of claim 1, wherein the metallurgical bond comprises an intermetallic.

3. The device of claim 1, further comprising an electroplated material on the conductor.

4. The device of claim 1, in which the disposed conductor is configured as a pattern or line on the substrate.

* * * * *